United States Patent
Joish

(10) Patent No.: US 9,813,040 B2
(45) Date of Patent: Nov. 7, 2017

(54) RESISTOR ATTENUATOR WITH SWITCH DISTORTION CANCELLATION

(71) Applicant: Texas Instruments Incorporated, Dallas, TX (US)

(72) Inventor: Rajendrakumar Joish, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/857,815

(22) Filed: Sep. 17, 2015

(65) Prior Publication Data

US 2016/0079949 A1    Mar. 17, 2016

(30) Foreign Application Priority Data

Sep. 17, 2014   (IN) .......................... 4523/CHE/2014

(51) Int. Cl.
| | |
|---|---|
| *H01P 1/22* | (2006.01) |
| *H03H 7/24* | (2006.01) |
| *H03F 1/56* | (2006.01) |
| *H03F 1/32* | (2006.01) |
| *H03F 3/45* | (2006.01) |

(52) U.S. Cl.
CPC ................. *H03H 7/24* (2013.01); *H01P 1/22* (2013.01); *H03F 1/3211* (2013.01); *H03F 1/56* (2013.01); *H03F 3/45475* (2013.01); *H03F 2203/45151* (2013.01); *H03F 2203/45594* (2013.01); *H03F 2203/45614* (2013.01); *H03F 2203/45616* (2013.01)

(58) Field of Classification Search
CPC ... H01P 1/22; H03H 7/24; H03H 7/25; H03H 7/253; H03H 7/255
USPC ......................................... 333/81 R, 17.2, 32
See application file for complete search history.

(56) References Cited

U.S. PATENT DOCUMENTS

| | | | | |
|---|---|---|---|---|
| 6,667,669 | B2* | 12/2003 | Goyette | H03H 7/255 327/306 |
| 7,162,375 | B2* | 1/2007 | Van Epps | G01R 1/06766 324/126 |
| 2015/0171828 | A1* | 6/2015 | Lam | H03H 11/245 333/81 R |

* cited by examiner

*Primary Examiner* — Stephen E Jones
(74) *Attorney, Agent, or Firm* — Andrew Viger; Charles A. Brill; Frank D. Cimino

(57) ABSTRACT

A programmable (multistep) resistor attenuator architecture (such as for input to a differential amplifier) provides cancellation for harmonic distortion currents. An attenuation node is coupled: (a) to an input node through R; (b) to a virtual ground through kR and a virtual ground switch Swf with on-resistance Rswf; and (c) to a differential ground through mR and a differential ground switch Swp with on-resistance Rswp. Swp can be sized relative to Swf such that a component Ipnf of Ipn through Rswp and mR to the attenuation node, and branching into kR and Rswf, matches (phase/magnitude), a harmonic current Ifn from the virtual ground through Rswf and kR to the attenuation node. Harmonic distortion cancelation at the virtual ground can be based on matching switches Swf and Swp and the resistors R, mR, kR, reducing sensitivity to PVT variations, input frequency and amplitude. The attenuator architecture is extendable to multistage configurations.

20 Claims, 2 Drawing Sheets

RESISTOR ATTENUATOR WITH SWITCH DISTORTION CANCELLATION

CROSS-REFERENCE TO RELATED APPLICATIONS

This application claims priority from Indian Provisional Patent Application No. 4523/CHE/2014 (TI-75375PS), filed Sep. 17, 2014, which is hereby incorporated by reference for all purposes.

BACKGROUND

Technical Field

This Patent Disclosure relates generally to multistep resistor attenuators, such as for use as a front-end signal attenuator.

Related Art

A multistep programmable resistor attenuator is configured from resistors and transistor switches, with transistor switching controlled to provide programmable step attenuation. The switches control current flow, and when on (conducting) are characterized by an Ron resistance.

FIG. 1 illustrates a current mode programmable resistor step attenuator, configured as a front-end signal attenuator for a differential amplifier. Signal current flows either to differential ground through the differential switches, or to the virtual grounds at the differential non-inverting and inverting inputs VGP,VGM. For example, a 6 dB step attenuator can be configured with Ra=Rs/2, and Rb=Rs.

Transistor non-linearities produce signal distortion in the form of extraneous frequency content. For example, transistors can produce significant low-order HD2 and HD3 harmonic distortion, with HD3 distortion particularly problematic in differential configurations.

Switch distortion can be reduced by increasing switch size, but that approach increases area and parasitics on the virtual ground.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a programmable (multistep) resistor attenuator with switch distortion cancellation.

According to aspects of the Disclosure, the programmable (multistep) resistor attenuator includes at last one attenuation stage coupled between a signal input node and a virtual ground node (such as an input to a differential amplifier). The attenuation node is: (a) coupled to the input node through a resistor R; (b) coupled to the virtual ground node through a resistor kR and a virtual ground switch Swf with an on resistance Rswf; and (c) coupled to a differential ground through a resistor mR and a differential ground switch Swp with an on resistance Rswp. Swp is sized relative to Swf such that, when both Swp and Swf are conducting, a component Ipnf of a current Ipn through Rswp and mR to the attenuation node and branching into kR and Rswf, matches, in phase and magnitude, a harmonic current Ifn from the virtual ground through Rswf and kR to the attenuation node, thereby substantially canceling the harmonic distortion appearing at the virtual ground. Distortion cancellation can be based on cancellation is based on matching switches Swf and Swp and the resistors R, mR, kR, and hence is insensitive to PVT variations, input frequency and amplitude. an optimum ratio of Rswp and Rswf is a function of only a ratio of resistors, and hence is insensitive to values of Rswp and Rswf. The attenuator architecture is extendable to multistage configurations.

Other aspects and features of the invention claimed in this Patent Document will be apparent to those skilled in the art from the following Disclosure.

DETAILED DESCRIPTION

This Description and the Drawings constitute a Disclosure for a programmable (multistep) resistor attenuator with switch distortion cancellation, including example embodiments that illustrate various technical features and advantages.

In brief overview, the programmable (multistep) resistor attenuator includes distortion cancellation for harmonic distortion currents. The attenuator includes at last one attenuation stage coupled between a signal input node and a virtual ground node (such as an input to a differential amplifier). The attenuation node is: (a) coupled to the input node through a resistor R; (b) coupled to the virtual ground node through a resistor kR and a virtual ground switch Swf with an on resistance Rswf; and (c) coupled to a differential ground through a resistor mR and a differential ground switch Swp with an on resistance Rswp. Swp is sized relative to Swf such that, when both Swp and Swf are conducting, a component Ipnf of a current Ipn through Rswp and mR to the attenuation node and branching into kR and Rswf, matches, in phase and magnitude, a harmonic current Ifn from the virtual ground through Rswf and kR to the attenuation node, thereby substantially canceling the harmonic distortion appearing at the virtual ground. Distortion cancellation can be based on cancellation is based on matching switches Swf and Swp and the resistors R, mR, kR, and hence is insensitive to PVT variations, input frequency and amplitude. an optimum ratio of Rswp and Rswf is a function of only a ratio of resistors, and hence is insensitive to values of Rswp and Rswf. The attenuator architecture is extendable to multistage configurations. In an example Application, the programmable resistor attenuator can be used as a front-end to an RF sampling ADC.

Figure 1:
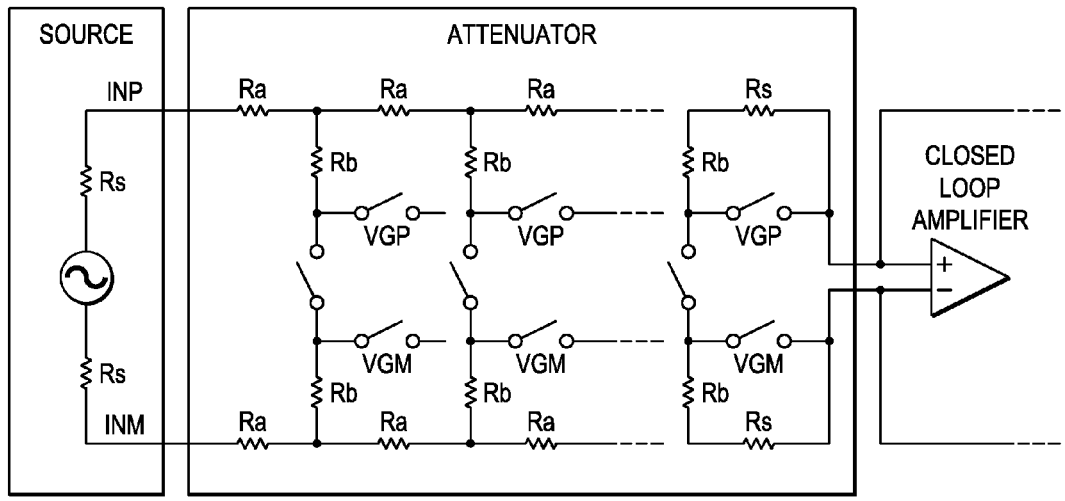
FIG. 1 illustrates a prior art current mode multistep resistor attenuator, configured as a front-end signal attenuator for a differential amplifier.
Figure 2:
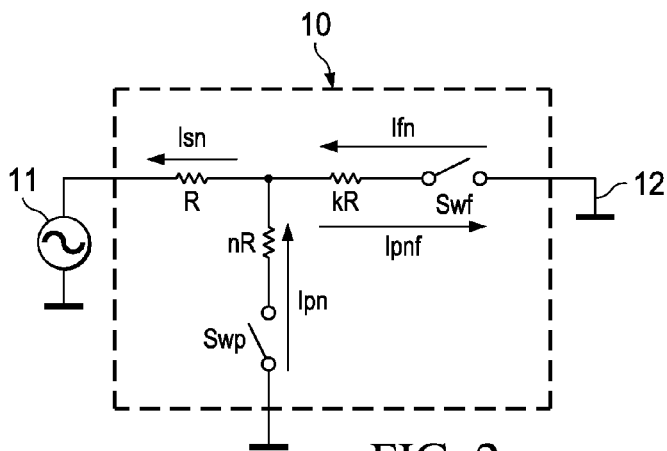
FIG. 2 functionally illustrates a programmable resistor attenuator in a simplified 2-step single-ended configuration, including figuratively illustrating switch distortion cancellation (Ifn-Ipnf) according to aspects of the Disclosure.

FIG. 2 functionally illustrates a programmable resistor attenuator 10, in a simplified 2-step single-ended configuration. Resistor attenuator 10 is configured to provide step attenuation for an input signal 11, with a single-ended output 12 at virtual ground, including switch distortion cancellation (Ifn-Ipnf) according to aspects of the Disclosure.

In the illustrative 2-step configuration, resistor attenuator 10 includes a switch Swp at differential ground, and a switch Swf at virtual ground. For this description, both Swf and Swp are ON. N is the order of the harmonic.

Swp at differential ground generates a harmonic current Ipn that opposes the corresponding harmonic current Ifn from Swf at virtual ground (Swf).

According to aspects of the Disclosure, Swp is sized such that Ipnf, the component of Ipn branching into Rswf, matches Ifn in phase and magnitude, thereby cancelling Swf/Swp switch distortion. Phase matching is accomplished by similarly biasing Swp and Swf. This distortion cancellation significantly reduces distortion for a given total switch size, thus achieving better performance without increasing area or parasitics on virtual ground.

Figure 3:
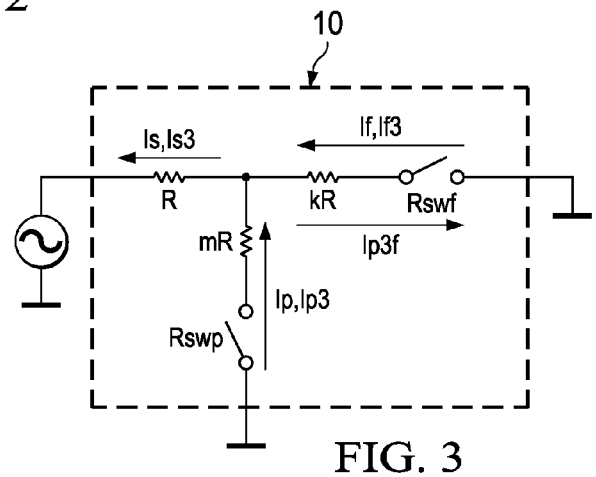
FIG. 3 functionally illustrates a programmable resistor attenuator in a simplified 2-step single-ended configuration, figuratively illustrating HD3 (third order) distortion cancellation (If3-Ip3f) according to aspects of the Disclosure.

FIG. 3 functionally illustrates programmable resistor attenuator 10 in a simplified 2-step single-ended configuration, figuratively illustrating HD3 (third order) distortion cancellation (If3-Ip3f). Typically, HD3 (n=3) is the major distortion component, so that Swp is sized to cancel If3.

For HD3 distortion cancellation, $$I_f = I_s - I_p \text{ and } I_{f3} = I_{s3} - I_{p3}$$

where $$I_f = V/R \times \frac{m}{m+k+mk}$$

$$I_p = V/R \times \frac{k}{m+k+mk}$$

$$I_{f3} = \alpha_{HD3}(VR_{swf}/R)^3 \times \left(\frac{m}{m+k+mk}\right)^3 \times \frac{1}{R\left(k+\frac{m}{m+1}\right)}$$

$$I_{p3} = \alpha_{HD3}(VR_{swp}/R)^3 \times \left(\frac{k}{m+k+mk}\right)^3 \times \frac{1}{R\left(k+\frac{k}{k+1}\right)}$$

and where $$(R_{swp}, R_{swf} << R, mR, kR)$$

The Ip3 component flowing into Rswf is $$I_{p3f} = \alpha_{HD3}(VR_{swp}/R)^3 \times \left(\frac{k}{m+k+mk}\right)^3 \times \frac{1}{R(m+k+mk)}$$

For zero HD3

$$I_{f3} = I_{p3f} \Rightarrow R_{swp} = R_{swf} \times \frac{m}{k}\sqrt[3]{m+1}$$

(assuming $\alpha_{HD3}$ for both currents is same)

The above expression for Rswp highlights two aspects of distortion cancellation according to aspects of the Disclosure: (1) cancellation is based on matching switches Swf and Swp and the resistors R, mR, kR, and hence is insensitive to PVT variations, input frequency and amplitude; and (2) an optimum ratio of Rswp and Rswf is a function of only a ratio of resistors, and hence is insensitive to values of Rswp and Rswf (assumed for R>>Rswp, and R>>Rswf).

Figure 4:
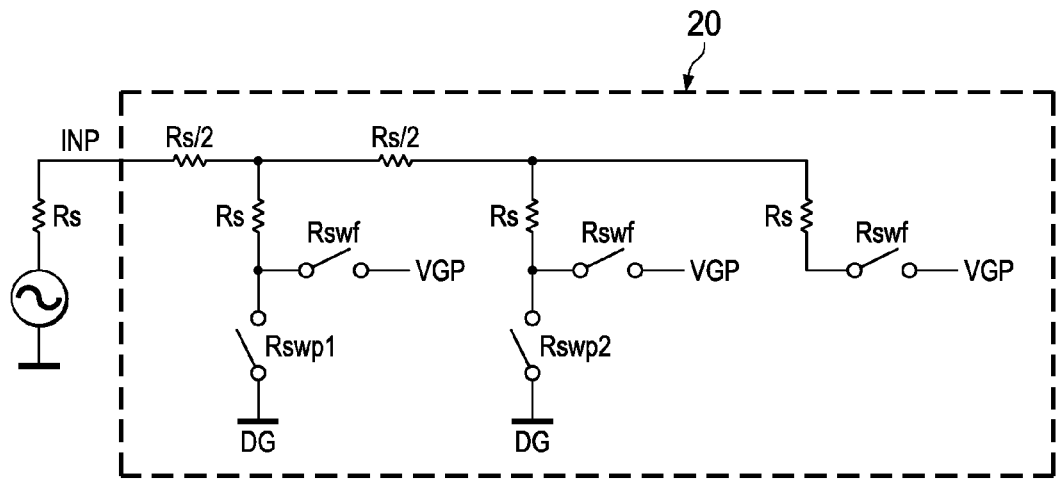
FIG. 4 functionally illustrates a programmable resistor attenuator (half differential), extended in a 3-step configuration according to aspects of the disclosure.

FIG. 4 functionally illustrates a programmable resistor attenuator 20, extended in a 3-step-6 dB configuration. Programmable resistor attenuator 20 is illustrated ion a half differential configuration, with signal input INP, and an attenuated output at VGP (virtual ground).

The optimum sizes for different switches at various settings are listed in the following table.

| Attenuation (dB) | Rswp1 (multiple of Rswf) | Rswp2 (multiple of Rswf) |
| --- | --- | --- |
| 0 | OFF | OFF |
| 6 | $\frac{1}{2}\sqrt[3]{\frac{5}{3}} = 0.593$ | OFF |
| 12 | 0.5 (arbitrarily chosen) | $\sqrt[3]{\frac{15}{11}} = 1.109$ |

For this design example, all switches to the (differential) input VGP are of same size, and have same resistance Rswf when ON.

For higher attenuations multiple optimum combinations are possible for Rswp1/2 values. Rswp1 can be arbitrarily fixed to obtain optimum Rswp2.

Figure 5A:
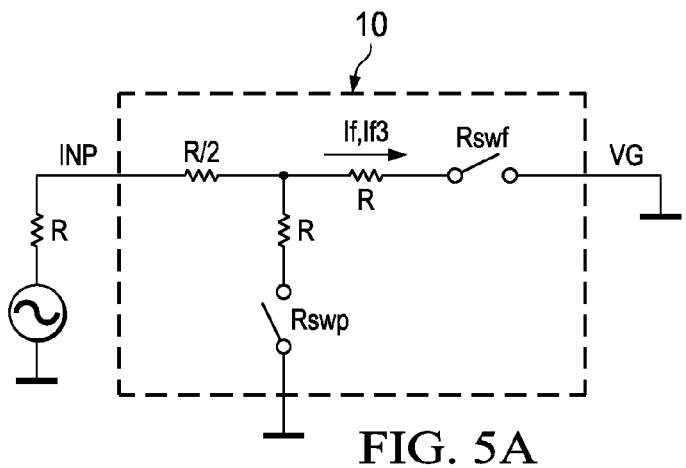
FIGS. 5A and 5B functionally illustrate respectively a 2-step and 3-step programmable resistor attenuator (half differential), used in describing a design example for switch distortion cancellation according to aspects of the Disclosure.
Figure 5B:
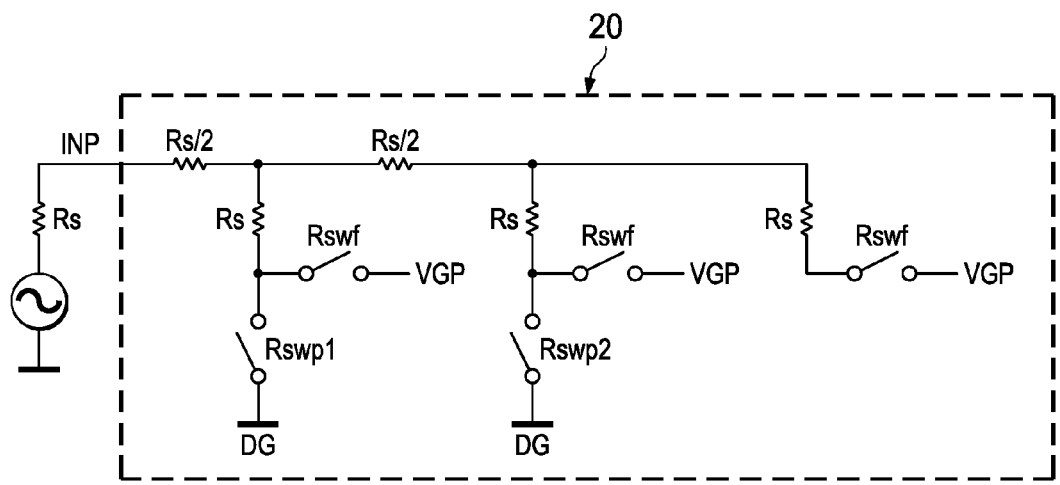

FIGS. 5A and 5B functionally illustrate respectively a 2-step and 3-step programmable resistor attenuator 10 and 20 (half differential). FIGS. 5A and 5B are used in describing the following illustrative design examples.

For the following 2-step and 3-step-6 dB design examples, values are single-ended, but example implementation is differential.

For the 2-step design example: R=50 ohms, Rswf=3.2 ohms (75 fingers of a unit W/L); Optimum Rswp=1.186*Rswf (63 fingers); If=10 mA at 2 GHz; and for IMD3 f1=2 GHz, f2=2.2 GHz.

For the 3-step design example: Rs=50 ohms, Rswf=4 ohms (60 fingers of a unit W/L); If=10 mA at 2 GHz; and for IMD3 f1=2 GHz, f2=2.2 GHz.

For these design examples, illustrative simulation results for HD3 and IMD3 were as follows.

HD3 in 2-step attenuator: For fingers of Swf=75, optimum fingers for Swp from calculation~63. HD3 sweep with Swp fingers shows minimum at around 63. An improvement of around 8 dB is seen compared to the case which uses Rswf=Rswp (pmp=75).

IMD3 in 2-step attenuator: With two tones, plots of 2f2-f1 and 2f1-f2 are shown for the 2 step attenuator. Optimum occurs~60 fingers. An improvement of around 14 dB is seen for IMD tones compared to Rswp=Rswf case.

HD3 in 3-step attenuator at 6 dB: For fingers of Swf=60, optimum fingers for Swp1 at 6 dB from calculation~101. HD3 sweep with Swp fingers shows minimum at around 100. An improvement of around 6 dB is seen compared to the case which uses Rswp1=Rswf/2 (pmp1=120).

IMD3 in 3-step attenuator at 6 dB: With two tones, plots of 2f2-f1 and 2f1-f2 are shown for 6 dB case. Optimum occurs~100 fingers. An improvement of around 14 dB is seen for IMD tones compared to Rswp1=Rswf/2 case.

HD3 in 3-step attenuator at 12 dB: For fingers of Swf=60 & of Swp1=120, optimum fingers for Swp2 at 12 dB from calculation~54. HD3 sweep with Swp fingers shows minimum at around 54. An improvement of around 8 dB is seen compared to the case which uses Rswp2=Rswf (pmp2=60)

IMD3 in 3-step attenuator at 12 dB: With two tones, plots of 2f2-f1 and 2f1-f2 are shown for 12 dB case. Optimum occurs~54 fingers. An improvement of around 12 dB is seen for IMD tones compared to Rswp2=Rswf case.

HD3 sweeps in 3-step attenuator at 12 dB: Nested sweeps of fingers of Swf and Swp2 for 12 dB case in which Swf fingers are swept from 50 to 70 and Swp2 from 40 to 70. The optimum of Swp2 shifted with Swf variation, and cancellation progressively improved with higher fingers of Swf.

Advantages of the programmable (multistep) resistor attenuator with switch distortion cancellation include the following. Cancellation of harmonic current of virtual ground switches with that of differential ground switches by optimum switch sizing (Swp and Swf) by exploiting matching between switches (transistors) and ratios of resistors. Due to this distortion cancellation, to meet a given distortion specification, switch sizes can be reduced, with attendant reduced area and parasitics on virtual ground. Distortion cancellation is robust across PVT, input amplitude and frequency, since it relies on ratio of resistors and matching of transistor switches.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A circuit, comprising
    an input node coupled to receive an input signal;
    virtual ground circuitry to provide a virtual ground node;
    at least one attenuation stage including an attenuation node, the attenuation node:
        coupled to the input node through a resistance R,
        coupled to the virtual ground node through a resistance kR and a virtual ground switch Swf with an on resistance Rswf, and
        coupled to a circuit ground node through a resistance mR and a circuit ground switch Swp with an on resistance Rswp;
        Swp sized relative to Swf such that, when both Swp and Swf are conducting, a component current Ipnf of a current Ipn through Rswp and mR to the attenuation node, and branching into kR and Rswf, matches, in phase and magnitude, a harmonic current Ifn from the virtual ground node through Rswf and kR to the attenuation node.

2. The circuit of claim 1, wherein Ipnf and Ifn are matched in phase based on biasing Swp and Swf.

3. The circuit of claim 1, wherein the circuit is a differential circuit, and:
    the input signal is a differential input signal; and
    the virtual ground circuitry comprises a differential closed loop amplifier with inverting and non-inverting inputs providing differential virtual ground nodes.

4. The circuit of claim 1, wherein the resistances kR and mR are provided by a single resistor coupled between the attenuation node and both the virtual ground switch Swf and the circuit ground switch Swp.

5. The circuit of claim 1, further comprising multiple attenuation stages, with associated circuit ground and virtual ground switches Swp and Swf controlled to provide multiple steps of attenuation.

6. The circuit of claim 1, wherein, matching the component current Ipnf and the harmonic current Ifn in phase and magnitude substantially cancels harmonic distortion appearing at the virtual ground node.

7. The circuit of claim 1, wherein the order of the harmonic is n=3, so that Ipnf=Ip3f, and fn=If3.

8. The method of claim 1, further comprising
    providing multiple attenuation stages, each with associated circuit ground and virtual ground switches Swp and Swf; and
    controlling respective circuit ground and virtual ground switches Swp and Swf to provide multiple steps of attenuation.

9. A circuit, comprising
    differential input nodes coupled to receive a differential input signal;
    differential virtual ground circuitry to provide differential virtual ground nodes;
    at least one attenuation stage including differential attenuation nodes, the differential attenuation nodes:
        coupled to a respective differential input node through a respective resistance R,
        coupled to a respective differential virtual ground node through a respective resistance kR and respective differential virtual ground switches Swf each with an on resistance Rswf, and
        coupled to a differential ground node through respective resistances mR and respective differential ground switches Swp each with an on resistance Rswp;
        Swp sized relative to Swf such that, when both Swp and Swf are conducting, a component current Ipnf of a current Ipn through Rswp and mR to a respective attenuation node and branching into kR and Rswf, matches, in phase and magnitude, a harmonic current Ifn from the respective differential virtual ground node through Rswf and kR to the respective differential attenuation node.

10. The circuit of claim 9, wherein Ipnf and Ifn are matched in phase based on biasing Swp and Swf.

11. The circuit of claim 9, wherein the differential virtual ground circuitry comprises a differential closed loop amplifier with inverting and non-inverting inputs providing the differential virtual ground nodes.

12. The circuit of claim 9, wherein the resistances kR and mR are provided by a single resistor coupled between a respective differential attenuation node and both of a respective virtual ground switch Swf and a respective differential ground switch Swp.

13. The circuit of claim 9, further comprising multiple attenuation stages, with associated differential ground and differential virtual ground switches Swp and Swf controlled to provide multiple steps of attenuation.

14. The circuit of claim 9, wherein, matching the component current Ipnf and the harmonic current Ifn in phase and magnitude substantially cancels harmonic distortion appearing at the differential virtual ground nodes.

15. The circuit of claim 6, wherein the order of the harmonic is n=3, so that Ipnf=Ip3f, and fn=If3.

16. A method for providing resistor attenuation at a virtual ground, comprising
    receiving an input signal at an input node;

configuring virtual ground circuitry to provide a virtual ground node;

providing at least one attenuation stage including an attenuation node, the attenuation node:

coupled to the input node through a resistance R, coupled to the virtual ground node through a resistance kR and a virtual ground switch Swf with an on resistance Rswf, and coupled to a circuit ground node through a resistance mR and a circuit ground switch Swp with an on resistance Rswp;

sizing Swp relative to Swf such that, when both Swp and Swf are conducting, a component Ipnf of a current Ipn through Rswp and mR to the attenuation node, and branching into kR and Rswf, matches, in phase and magnitude, a harmonic current Ifn from the virtual ground node through Rswf and kR to the attenuation node.

17. The method of claim 16, wherein, matching the component current Ipnf and the harmonic current Ifn in phase and magnitude substantially cancels harmonic distortion appearing at the differential virtual ground nodes.

18. The method of claim 16, wherein Ipnf and Ifn are matched in phase based on biasing Swp and Swf.

19. The method of claim 16, wherein the input signal is a differential input signal; and the virtual ground circuitry is differential virtual ground circuitry comprising a differential closed loop amplifier with inverting and non-inverting inputs providing differential virtual ground nodes.

20. The method of claim 16, wherein the resistances kR and mR are provided by a single resistor coupled between the attenuation node and both the virtual ground switch Swf and the circuit ground switch Swp.

* * * * *